US012787461B2

(12) United States Patent
Lu et al.

(10) Patent No.: US 12,787,461 B2
(45) Date of Patent: Nov. 3, 2026

(54) IMAGE SENSOR AND FORMATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Zhanjie Lu, Beijing (CN); Zhigao Wang, Beijing (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 379 days.

(21) Appl. No.: 18/524,910

(22) Filed: Nov. 30, 2023

(65) Prior Publication Data

US 2024/0186362 A1 Jun. 6, 2024

(30) Foreign Application Priority Data

Dec. 5, 2022 (CN) ......................... 202211548152.6

(51) Int. Cl.
*H10F 39/00* (2025.01)

(52) U.S. Cl.
CPC ......... *H10F 39/024* (2025.01); *H10F 39/811* (2025.01)

(58) Field of Classification Search
CPC .... H10F 39/024; H10F 39/811; H10F 39/014; H10F 39/12; H10F 39/199; H10F 39/8053; H10F 39/8063; H10F 39/807; H10F 39/011
See application file for complete search history.

(56) References Cited

U.S. PATENT DOCUMENTS

| | | | | |
|---|---|---|---|---|
| 10,204,964 B1 * | 2/2019 | Lee | H10F 39/014 | |
| 12,191,335 B2 * | 1/2025 | Park | H10F 39/024 | |
| 12,266,674 B2 * | 4/2025 | Jang | H10F 39/802 | |
| 12,336,313 B2 * | 6/2025 | Chung | H10F 39/8053 | |
| 2015/0263054 A1 * | 9/2015 | Chien | H10F 39/024 | 257/292 |
| 2015/0349001 A1 * | 12/2015 | Wang | H10F 39/014 | 257/443 |
| 2016/0254299 A1 * | 9/2016 | Gomi | H04N 25/75 | 257/447 |

(Continued)

*Primary Examiner* — Steven H Loke
*Assistant Examiner* — Khatib A Rahman
(74) *Attorney, Agent, or Firm* — Anova Law Group, PLLC

(57) ABSTRACT

An image sensor and a formation method of the image sensor are provided in the present disclosure. The method includes forming an array substrate, where a photosensitive device is in the array substrate; forming an interconnection structural layer on the array substrate; forming a passivation structural layer on the interconnection structural layer; and forming a connection pad and an isolation wall in the passivation structural layer. The connection pad is electrically connected to the photosensitive device; and the isolation wall is between adjacent photosensitive devices and at least passes through the passivation structural layer and extends to the interconnection structural layer.

10 Claims, 5 Drawing Sheets

(56) References Cited

U.S. PATENT DOCUMENTS

| | | | | |
|---|---|---|---|---|
| 2017/0200758 | A1* | 7/2017 | Jung | H10F 39/014 |
| 2018/0190707 | A1* | 7/2018 | Lee | H04N 25/76 |
| 2019/0148442 | A1* | 5/2019 | Huang | H10F 39/014<br>257/459 |
| 2022/0384494 | A1* | 12/2022 | Morimoto | H10F 39/182 |
| 2023/0170371 | A1* | 6/2023 | Lee | H10F 39/18 |
| 2024/0162262 | A1* | 5/2024 | Wang | H10F 39/018 |

* cited by examiner

IMAGE SENSOR AND FORMATION METHOD THEREOF

CROSS-REFERENCE TO RELATED APPLICATION

This application claims the priority of Chinese Patent Application No. 202211548152.6, filed on Dec. 5, 2022, the content of which is incorporated herein by reference in its entirety.

TECHNICAL FIELD

The present disclosure generally relates to the field of semiconductor manufacturing and, more particularly, relates to an image sensor and a formation method thereof.

BACKGROUND

Direct time-of-flight (dToF) measurement is a common optical ranging manner and widely used in optical ranging systems such as lidar. In the direct time-of-flight measurement manner, the intensity of a pulse light signal is not recorded, and only emission time of the pulse light signal and the time that the pulse light signal is detected are recorded; and the difference between emission time of the pulse light signal and the time that the pulse light signal is directly converted into distance information.

A single point direct time-of-flight (1D dToF) measurement device is an optical depth sensor based on a single or small-scale single photon avalanche diode (SPAD) detector array. The optical detection module of above device may integrate a pixel unit, a high-speed and high-precision time to digital converter (TDC) circuit and a microcontroller circuit for data processing, which are included in the SPAD detector, on a same chip. The SPAD detector may have a relatively large size, a relatively small ratio of optical stack height to lateral size and a relatively large photosensitive area. The SPAD detector may be manufactured using a front side illumination (FSI) process which may realize product design with high yield, low cost, small size and low power consumption.

The single point direct time-of-flight measurement device has a simple and compact structure and is suitable for applications that do not require a high number of pixels and focuses on power consumption and cost. At present, the single point direct time-of-flight measurement is widely used in the fields of live recognition using notebooks and mobile phones, distance detection of sweeping robots, intelligent focus technology of projectors, smart homes, modern logistics, industrial Internet of Things, and other fields.

However, existing single point direct time-of-flight measurement devices have strong optical signal crosstalk and poor signal-to-noise ratio.

SUMMARY

One aspect of the present disclosure provides a formation method of an image sensor. The method includes forming an array substrate, where a photosensitive device is in the array substrate; forming an interconnection structural layer on the array substrate; forming a passivation structural layer on the interconnection structural layer; and forming a connection pad and an isolation wall in the passivation structural layer, where the connection pad is electrically connected to the photosensitive device; and the isolation wall is between adjacent photosensitive devices and at least passes through the passivation structural layer and extends to the interconnection structural layer.

Optionally, forming the connection pad and the isolation wall in the passivation structural layer includes forming the isolation wall passing through the interconnection structural layer and extending into the array substrate.

Optionally, the array substrate is formed, such that the photosensitive device is in a well region; and the connection pad and the isolation wall are formed in the passivation structural layer, such that the isolation wall extends to have a depth at a level where the well region is located.

Optionally, forming the connection pad and the isolation wall in the passivation structural layer includes forming a trench in the passivation structural layer, where the trench passes through the passivation structural layer and extends into the interconnection structural layer; forming an opening in the passivation structural layer; and forming both the connection pad in the opening and the isolation wall in the trench.

Optionally, forming the connection pad and the isolation wall in the passivation structural layer further includes after forming the trench in the passivation structural layer and before forming the isolation wall in the trench, forming an insulation structural layer on a sidewall and a bottom of the trench; and forming the isolation wall in the trench in which the insulation structural layer is formed.

Optionally, forming the connection pad and the isolation wall in the passivation structural layer includes forming the trench in the passivation structural layer; forming the insulation structural layer on the sidewall and the bottom of the trench; after forming the insulation structural layer, forming the opening in the passivation structural layer; and after forming the opening, filling the opening and the trench with a conductive material to form both the connection pad in the opening and the isolation wall in the trench.

Optionally, the method further includes forming a protection structural layer on the connection pad and the isolation wall; forming a first opening and a second opening in the protection structural layer, where a bottom of the first opening exposes the connection pad, and a bottom of the second opening exposes the isolation wall; and at least forming a connection structure in the second opening.

Optionally, the image sensor is a front side illumination image sensor.

Optionally, the method further includes forming a light receiving structure on the passivation structural layer in which the connection pad and the isolation wall is formed.

Optionally, forming the light receiving structure includes forming a color filter layer and a lens layer sequentially on the passivation structural layer.

Another aspect of the present disclosure provides an image sensor. The image sensor includes an array substrate, where a photosensitive device is in the array substrate; an interconnection structural layer, on the array substrate; a passivation structural layer, on the interconnection structural layer; a connection pad, in the passivation structural layer and electrically connected to the photosensitive device; and an isolation wall, between adjacent photosensitive devices and at least passing through the passivation structural layer and extending to the interconnection structural layer.

Optionally, the isolation wall passes through the interconnection structural layer and extends into the array substrate.

Optionally, the photosensitive device is in a well region; and the isolation wall extends to have a depth at a level where the well region is located.

Optionally, the image further includes an insulation structural layer, at least between the isolation wall and the interconnection structural layer.

Optionally, the isolation wall further extends into the array substrate; and the insulation structural layer further extends between the isolation wall and the array substrate.

Optionally, a material of the connection pad is same as a material of the isolation wall.

Optionally, the image sensor further includes a protection structural layer, covering the connection pad and the isolation wall; and a connection structure, passing through the protection structural layer to be electrically connected to the isolation wall.

Optionally, the image sensor is a front side illumination image sensor.

Optionally, the image sensor further includes a light receiving structure, on the passivation structural layer.

Optionally, the light receiving structure includes a color filter layer on the passivation structural layer and a lens layer on the color filter layer.

Compared with the existing technology, the technical solutions provided by the present disclosure may achieve at least the following beneficial effects.

In optional solutions provided in the present disclosure, the isolation wall may be formed in the passivation structural layer, and the isolation wall may be between adjacent photosensitive devices and at least pass through the passivation structural layer and extend to the interconnection structural layer. The isolation wall may achieve optical isolation between adjacent photosensitive devices to suppress optical signal crosstalk and improve the signal-to-noise ratio.

In optional solutions provided in the present disclosure, the isolation wall may also extend into the array substrate and extend to have the depth at the level where the well region is located. The isolation wall may be suitable for being connected to a negative potential, such that positive charges may accumulate near the isolation wall, thereby effectively preventing dark current increase in the interface state at the location of the isolation wall and effectively reducing dark count rate (DCR).

In optional solutions provided in the present disclosure, the conductive material may be filled into the opening and the trench to form the connection pad in the opening and the isolation wall in the trench. The isolation wall and the connection pad may be formed in a same process; on the basis of existing process, the isolation wall may be formed without adding excessively additional process steps, and the process may be simple with low cost.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

References are made in detail to exemplary embodiments of the present disclosure, which are illustrated in accompanying drawings. Wherever possible, same reference numbers are used throughout accompanying drawings to refer to same or like parts.

An image sensor and a formation method of the image sensor are provided in the present disclosure. The method includes forming an array substrate, where a photosensitive device is in the array substrate; forming an interconnection structural layer on the array substrate; forming a passivation structural layer on the interconnection structural layer; and forming a connection pad and an isolation wall in the passivation structural layer, where the connection pad is electrically connected to the photosensitive device; and the isolation wall is between adjacent photosensitive devices and at least passes through the passivation structural layer and extends to the interconnection structural layer.

It can be known from the background that image sensors in the existing technology have problems such as strong optical crosstalk and poor signal-to-noise ratio. The reasons for strong optical crosstalk and poor signal-to-noise ratio are described based on the structure of an image sensor.

Figure 1:
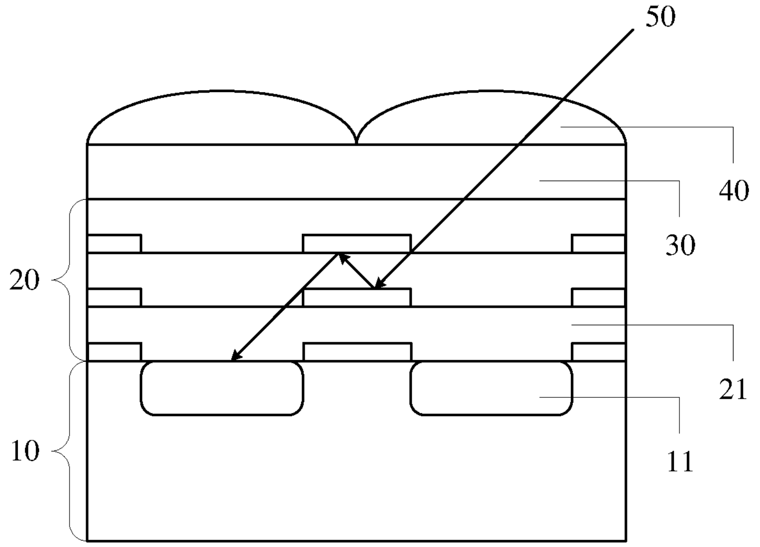
FIG. 1 illustrates a cross-sectional structural view of an image sensor according to various disclosed embodiments of the present disclosure.

FIG. 1 illustrates a cross-sectional structural view of an image sensor according to various disclosed embodiments of the present disclosure.

The image sensor may include an array substrate 10, where a photosensitive device 11 may be in the array substrate 10; and an interconnection structural layer 20 on the array substrate 10. The interconnection structural layer 20 may include a plurality of interconnection layers 21 stacked with each other sequentially.

The image sensor may be a front side illumination image sensor to control cost and ensure yield and reliability. A light receiving structure including a color filter layer 30 and a lens layer 40 may be on the interconnection structural layer 20.

As shown in FIG. 1, the incident light 50 through the light receiving structure may be received by the photosensitive device 11 in the array substrate 10 after transmitting through the interconnection structural layer 20. The plurality of interconnection layers 21 of the interconnection structural layer 20 may cause interference during light transmission. The reflection and scattering of light by the plurality of interconnection layers 21 may not only reduce photon detection efficiency (PDE) of the photosensitive device 11, but also cause optical crosstalk between different photosensitive devices 11.

The size of the photosensitive device 11 may be increased to increase the area of a photosensitive region, which may improve photon detection efficiency. However, for a same array substrate 10, the probability of thermal excitation and tunneling effects that cause dark carrier generation to occur per unit volume may be stable. Therefore, as the size of the photosensitive device 11 increases, the dark current may increase, and the signal-to-noise ratio may decrease. Especially, when the photosensitive device is a single photon detector, the dark current may increase and the dark count may increase, which may directly affect counting accuracy.

In order to solve above-mentioned technical problem, the present disclosure provides an image sensor and a formation method of the image sensor. An isolation wall may be formed in a passivation structural layer, and the isolation wall may be between adjacent photosensitive devices and at least pass through the passivation structural layer and extend to an interconnection structural layer. The isolation wall may achieve optical isolation between adjacent photosensitive devices to suppress optical signal crosstalk and improve the signal-to-noise ratio.

In order to clearly illustrate above-mentioned described objectives, features, and advantages of the present disclosure, various embodiments of the present disclosure are described in detail with reference to accompanying drawings hereinafter.

FIGS. 2-9 illustrate cross-sectional structural views corresponding to certain stages of an exemplary formation method of an image sensor according to various disclosed embodiments of the present disclosure.

Figure 2:
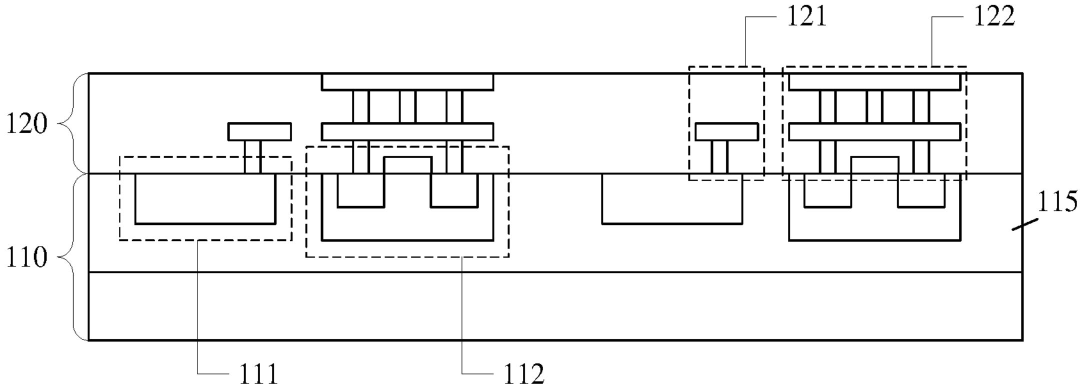
FIGS. 2-9 illustrate cross-sectional structural views corresponding to certain stages of an exemplary formation method of an image sensor according to various disclosed embodiments of the present disclosure.
Figure 10:
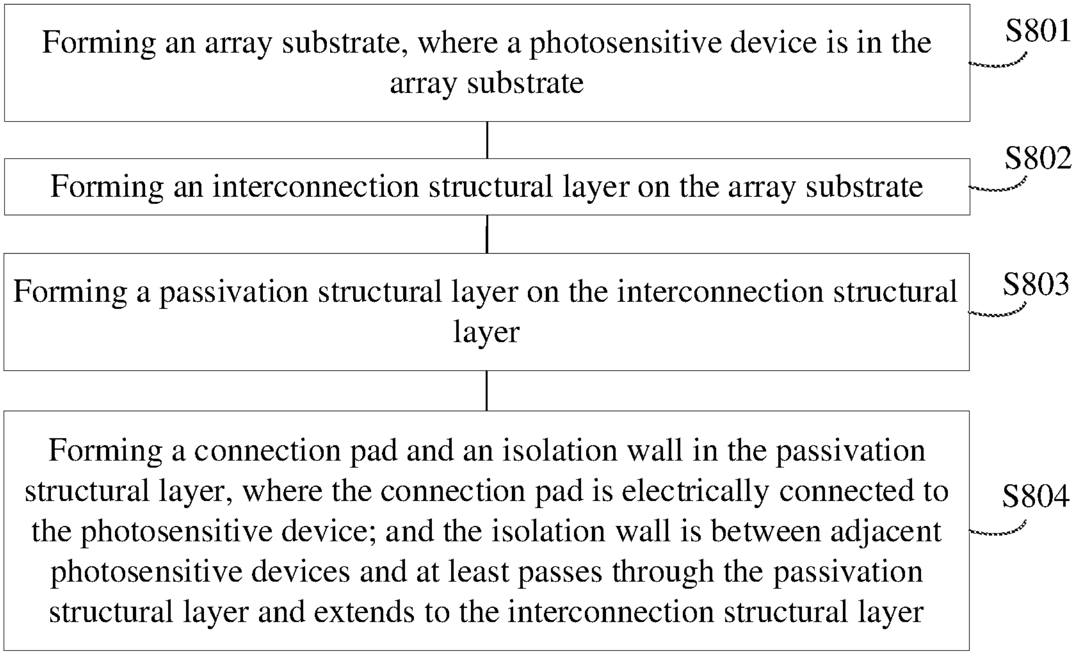
FIG. 10 illustrates a flowchart of an exemplary formation method of an image sensor according to various disclosed embodiments of the present disclosure.

Referring to FIG. 2, an array substrate 110 may be formed, and a photosensitive device 111 may be in the array substrate 110 (e.g., in S801 of FIG. 10).

The array substrate 110 may be configured to form and accommodate the photosensitive device 111.

The array substrate 110 may include a substrate and the photosensitive device 111 in the substrate.

The substrate may be a working platform for subsequent processes. The material of the substrate may be selected from single crystal silicon, polycrystalline silicon or amorphous silicon; silicon, germanium, a gallium arsenide compound or a silicon germanium compound; a structure with an epitaxial layer or a silicon on an epitaxial layer; or other suitable semiconductor materials, which may not be limited in the present disclosure. In some embodiments, the substrate may be a silicon substrate.

The photosensitive device 111 may be configured to achieve photoelectric conversion. For example, the photosensitive device 111 may be a photodiode (PD). As shown in FIG. 2, in some embodiments, a plurality of photosensitive devices 111 may be in the array substrate 110. For example, FIG. 2 illustrates two photosensitive devices 111 in the array substrate 110.

As shown in some embodiments of FIG. 2, the array substrate 110 may further include a switching device 112. The switching device 112 may be connected to the photosensitive device 111 and configured to control the transmission of photoelectrons generated by the photosensitive device 111. In some embodiments, the array substrate 110 may include a plurality of switching devices 112 correspondingly connected to the plurality of photosensitive devices 111.

Forming the array substrate 110 may include forming a patterned photoresist layer on the surface of the substrate; using the patterned photoresist layer as a mask to perform ion implantation and forming the photosensitive device 111 in the substrate; after forming the photosensitive device 111, striping the photoresist layer; and performing rapid thermal annealing (RTA) and other steps to form the array substrate 110.

In some embodiments, the array substrate 110 may further include the switching device 112. The switching device 112 may be formed in a same process as the photosensitive device 111, or may be formed in a different process from the photosensitive device 111.

In some embodiments of the present disclosure, forming the array substrate 110 may include forming the photosensitive device 111 in a well region 115. For example, entire photosensitive device 111 may be in the well region 115. In some embodiments, the array substrate 110 may further include the switching device 112; and the switching device 112 may be also in the well region 115.

Referring to FIG. 2, an interconnection structural layer 120 may be formed on the array substrate 110 (e.g., in S802 of FIG. 10).

The interconnection structural layer 120 may be configured to realize electrical connection between the array substrate 110 and subsequent circuits.

For example, as shown in FIG. 2, the interconnection structural layer 120 may include a first interconnection part 121; the first interconnection part 121 may be electrically connected to the photosensitive device 111; and the plurality of first interconnection parts 121 may be correspondingly connected to the plurality of photosensitive devices 111.

In some embodiments, the array substrate 110 may further include the switching device 112; the interconnection structural layer 120 may further include a second interconnection part 122; the second interconnection part 122 may be electrically connected to the switching device 112; and the plurality of second interconnection parts 122 may be correspondingly connected to the plurality of switching devices 112.

In addition, the interconnection structural layer 120 may further include a dielectric material. The dielectric material may be filled between the interconnection parts to achieve insulation. For example, the dielectric material may be filled between the first interconnection part 121 and the second interconnection part 122. The material may be selected from silicon oxide, silicon nitride, silicon oxynitride, a low K dielectric material (dielectric constant greater than or equal to 2.5 and less than 3.9) or an ultra-low K dielectric material (dielectric constant less than 2.5), or a combination thereof.

Figure 3:
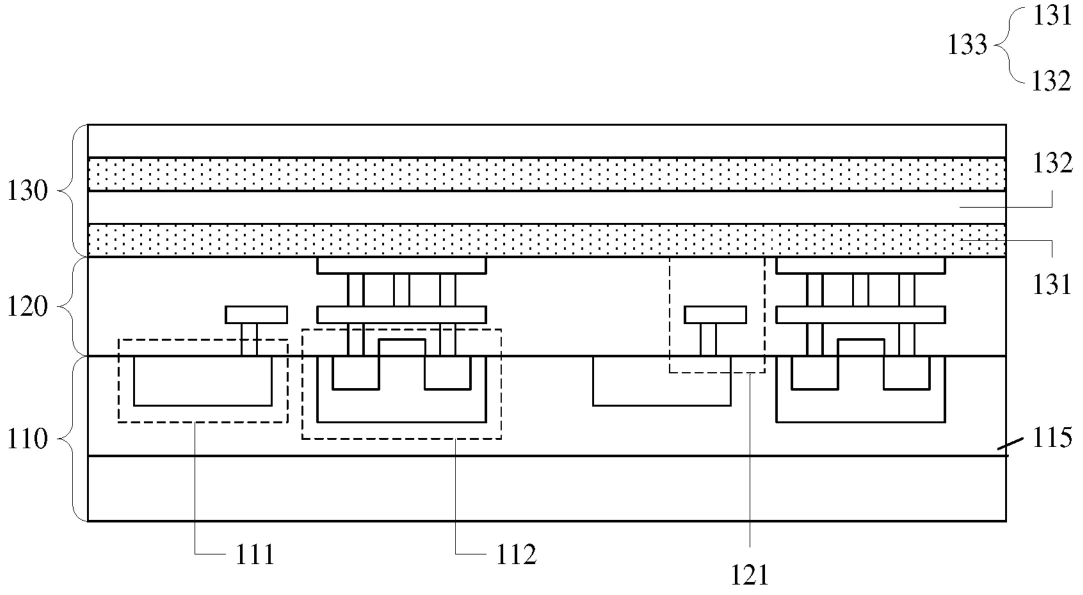

Referring to FIG. 3, a passivation structural layer 130 may be formed on the interconnection structural layer 120 (e.g., in S803 of FIG. 10).

The passivation structural layer 130 may be configured to encapsulate and protect the interconnection structural layer 120 and electronic components in the interconnection structural layer 120.

In some embodiments of the present disclosure, the passivation structural layer 130 may include a plurality of passivation stacked layers 133. The passivation stacked layer 133 may include a first passivation layer 131 and a second passivation layer 132 stacked with each other sequentially. For example, in one embodiment shown in FIG. 3, the passivation structural layer 130 may include two passivation stacked layers 133. That is, the passivation structural layer 130 may include two first passivation layers 131 and two second passivation layers 132 which are alternately arranged.

In some embodiments of the present disclosure, the first passivation layer 131 may be a TEOS layer, that is, a tetraethylorthosilicate layer; and the second passivation layer 131 may be a silicon nitride layer. The passivation structural layer 130 may be formed by a film deposition manner including chemical vapor deposition, physical vapor deposition, atomic layer deposition, or the like.

Referring to FIGS. 4-7, a connection pad 141 and an isolation wall 142 may be formed in the passivation structural layer 130; the connection pad 141 may be electrically connected to the photosensitive device 111; and the isolation wall 142 may be between adjacent photosensitive devices 111, at least pass through the passivation structural layer 130 and extend to the interconnection structural layer 120 (e.g., in S804 of FIG. 10).

The connection pad 141 may be electrically connected to the photosensitive device 111 to realize the connection between the photosensitive device 111 and an external circuit.

In some embodiments of the present disclosure, the array substrate 110 may further include the switching device 112 connected to the photosensitive device 111; and the connection pad 141 may be connected to the switching device 112 to achieve electrical connection with the photosensitive device 111.

In some embodiments of the present disclosure, the material of the connection pad 141 may be aluminum. As shown in embodiments shown in FIGS. 4-7, the material of the connection pad 141 may be copper-doped aluminum, that is, Al/Cu.

The isolation wall 142 may be configured to reflect optical signals. Along the thickness direction, that is, along the direction perpendicular to the surface of the array substrate 110, the isolation wall 142 may pass through the passivation structural layer 130 and extend into the interconnection structural layer 120, which may effectively prevent lateral propagation of the optical signals in the passivation structural layer 130 and the interconnection structural layer 120 and effectively suppress the crosstalk of the optical signals.

Figure 4:
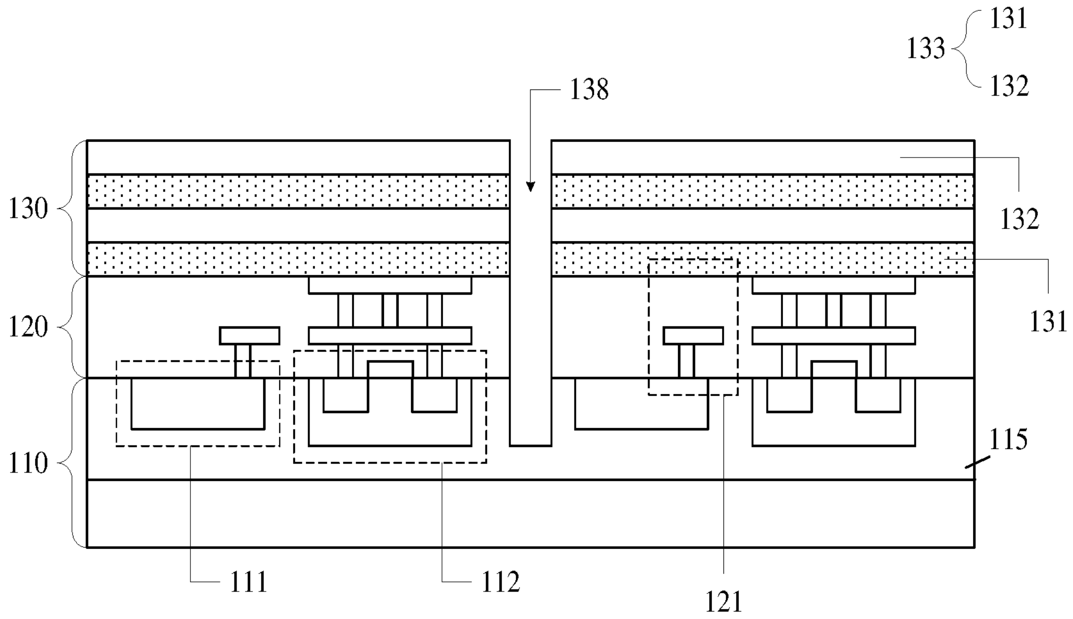
Figure 5:
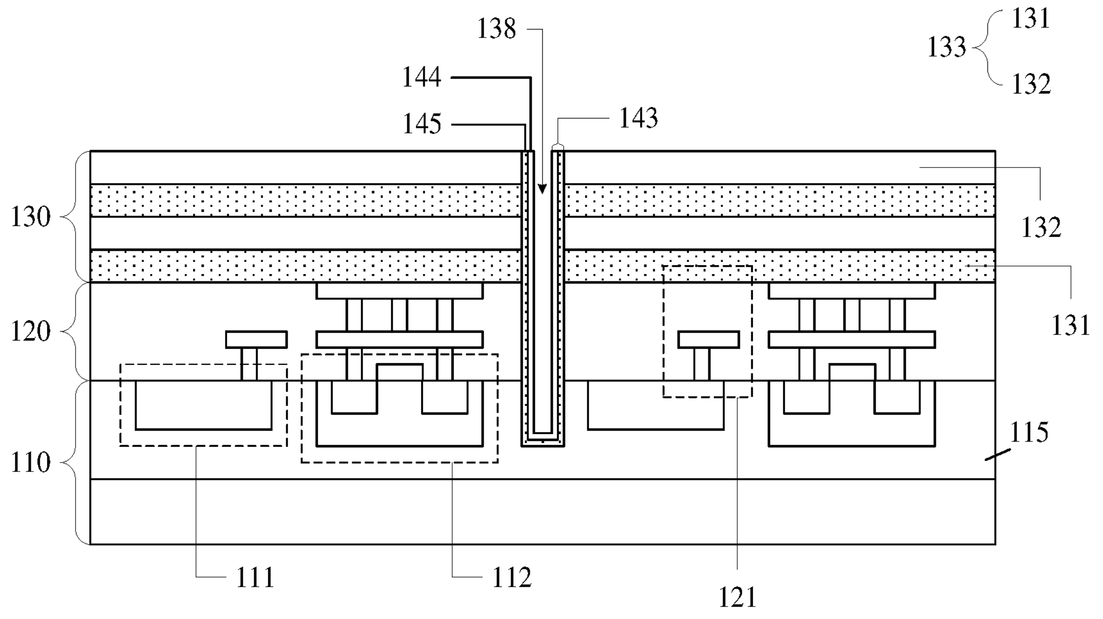
Figure 6:
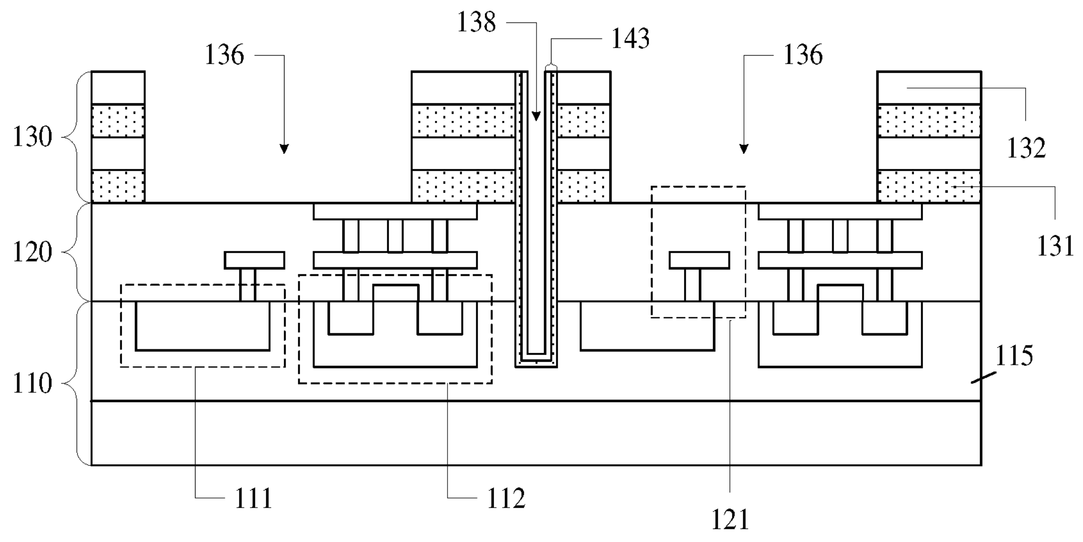

As shown in FIGS. 4-6, forming the connection pad 141 and the isolation wall 142 in the passivation structural layer 130 may include forming a trench 138 and an opening 136 in the passivation structural layer 130. The trench 138 and the opening 136 may be configured to provide process space for the formation of the isolation wall 142 and the connection pad 141 respectively.

Forming the trench 138 and the opening 136 in the passivation structural layer 130 may include forming the trench 138 in the passivation structural layer 130 as shown in FIG. 4, where the trench 138 may pass through the passivation structural layer 130 and extend into the interconnection structural layer 120; and forming the opening 136 in the passivation structural layer 130 as shown in FIG. 6.

In some embodiments of the present disclosure, forming the connection pad 141 and the isolation wall 142 in the passivation structural layer 130 may including forming the isolation wall 142 passing through the interconnection structural layer 120 and extending into the array substrate 110. Therefore, forming the trench 138 in the passivation structural layer 130 may including forming the trench passing through the passivation structural layer 130 and the interconnection structural layer 120, where the bottom of the trench may expose the array substrate 110 and extend into the array substrate 110.

In some embodiments of the present disclosure, the photosensitive device 111 may be formed in the well region 115; and the connection pad 141 and the isolation wall 142 may be formed in the passivation structural layer 130, such that the isolation wall 142 may extend into the array substrate 110, e.g., may have a bottom leveled with a depth of the well region 115 in the array substrate 110 along a lateral direction. Therefore, the trench 138 may be formed in the passivation structural layer 130, such that the trench may extend to have the depth at the level where the well region 115 is located. That is, the position of the bottom of the trench 138 may be adjacent to the position of the well region 115 on the side away from the interconnection structural layer 120.

For example, forming the trench 138 in the passivation structural layer 130 may include forming the trench 138 by photolithography and etching.

It should be noted that, as shown in FIG. 5, after the trench 138 is formed in the passivation structural layer 130 and before the isolation wall 142 in the trench 138 is formed, an insulation structural layer 143 may be formed on the sidewalls and bottom of the trench 138.

The insulation structural layer 143 may be configured to achieve electrical insulation between the isolation wall 142 and other electronic components.

The insulation structural layer 143 may be on the sidewalls and bottom of the trench 138, such that the insulation structural layer 143 may be on the sidewalls exposed by the passivation structural layer 130 and the sidewalls exposed by the interconnection structural layer 120. Moreover, in some embodiments as shown in FIG. 5, the trench 138 may also extend into the array substrate 110, such that the insulation structural layer 143 may be also on the exposed surface of the array substrate 110.

For example, the insulation structural layer 143 may include an insulation stacked layer. The insulation stacked layer may include a first insulation layer 144 and a second insulation layer 145 stacked with each other sequentially. For example, in one embodiment shown in FIG. 3, the insulation structural layer 143 may include one insulation stacked layer. That is, the insulation structural layer 143 may include the first insulation layer 144 and the second insulation layer 145 stacked with each other sequentially.

In some embodiments of the present disclosure, the first insulation layer 144 may be a TEOS layer, that is, a tetraethylorthosilicate layer; and the second insulation layer 145 may be a silicon nitride layer. The insulation structural layer 143 may be formed by a film deposition manner including chemical vapor deposition, physical vapor deposition or atomic layer deposition.

It should be noted that in some embodiments of the present disclosure, the trench 138 may be formed in the passivation structural layer 130 as shown in FIG. 4; the insulation structural layer 143 may be formed on the sidewalls and bottom of the trench 138 as shown in FIG. 5; and after the insulation structural layer 143 is formed, the opening 136 may be formed in the passivation structural layer 130 as shown in FIG. 6. The insulation structural layer 143 may be formed first, and then the opening 136 may be formed, which may effectively prevent the insulation structural layer 143 from covering the formed opening 136 and effectively reduce the number of removal processes, thereby being beneficial for improving yield rate.

Figure 7:
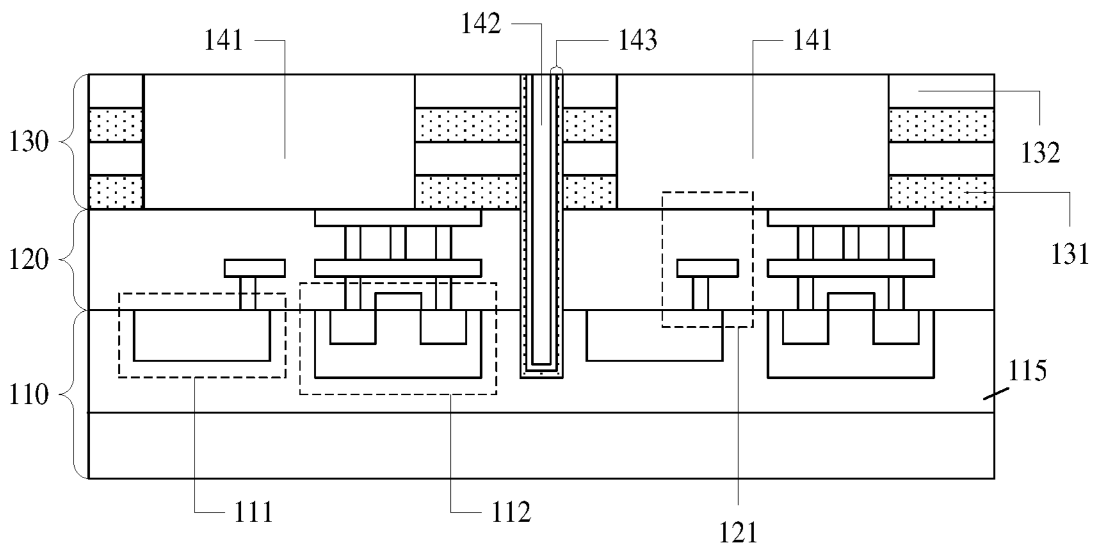

After the trench 138 and the opening 136 are formed, as shown in FIG. 7, the connection pad 141 in the opening 136 and the isolation wall 142 in the trench 138 may be formed. For example, the isolation wall 142 may be formed in the trench 138 in which the insulation structural layer 143 is formed.

As shown in FIG. 7, the insulation structural layer 143 may be between the isolation wall 142 and each of the passivation structural layer 130 and the interconnection structural layer 120 to achieve electrical insulation. In some embodiments of the present disclosure, the isolation wall 142 may also extend into the array substrate 110, such that the insulation structural layer 143 may also extend between the isolation wall 142 and the array substrate 110.

For example, after the opening 136 is formed, a conductive material may be filled into the opening 136 and the trench 138 to form the connection pad 141 in the opening 136 and the isolation wall 142 in the trench 138.

The isolation wall 142 and the connection pad 141 may be formed through a same filling process. Therefore, the material of the connection pad 141 may be same as the material of the isolation wall 142, which may effectively reduce formation process steps and process difficulty. In addition, since the material of the connection pad 141 includes aluminum, the material of the isolation wall 142 may also include aluminum, which may effectively improve reflectivity of the isolation wall 142 and effectively ensure the effect of preventing optical crosstalk.

Figure 8:
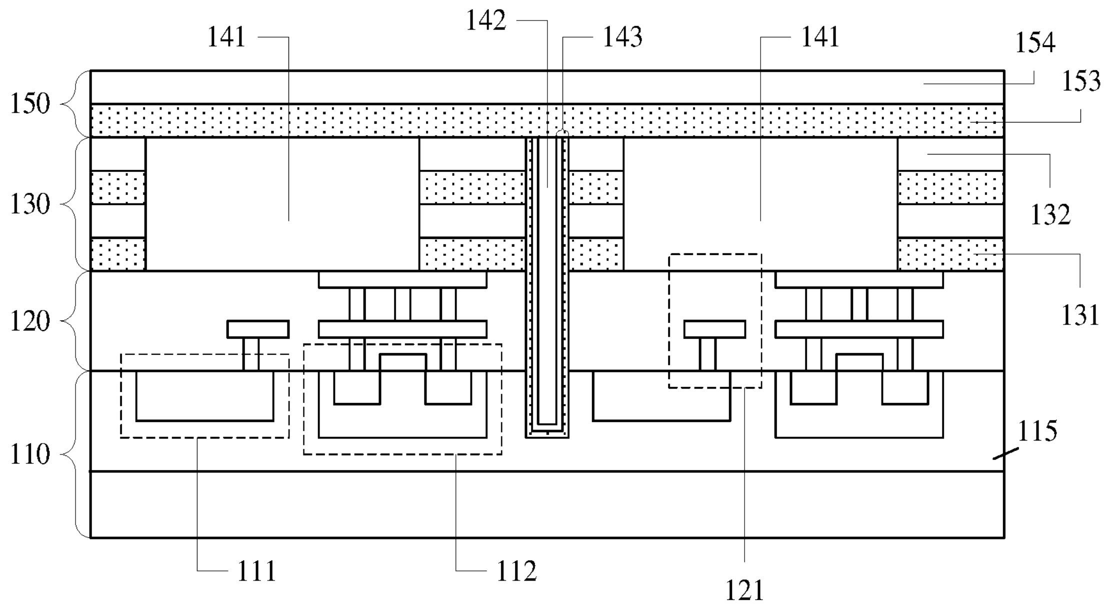
Figure 9:
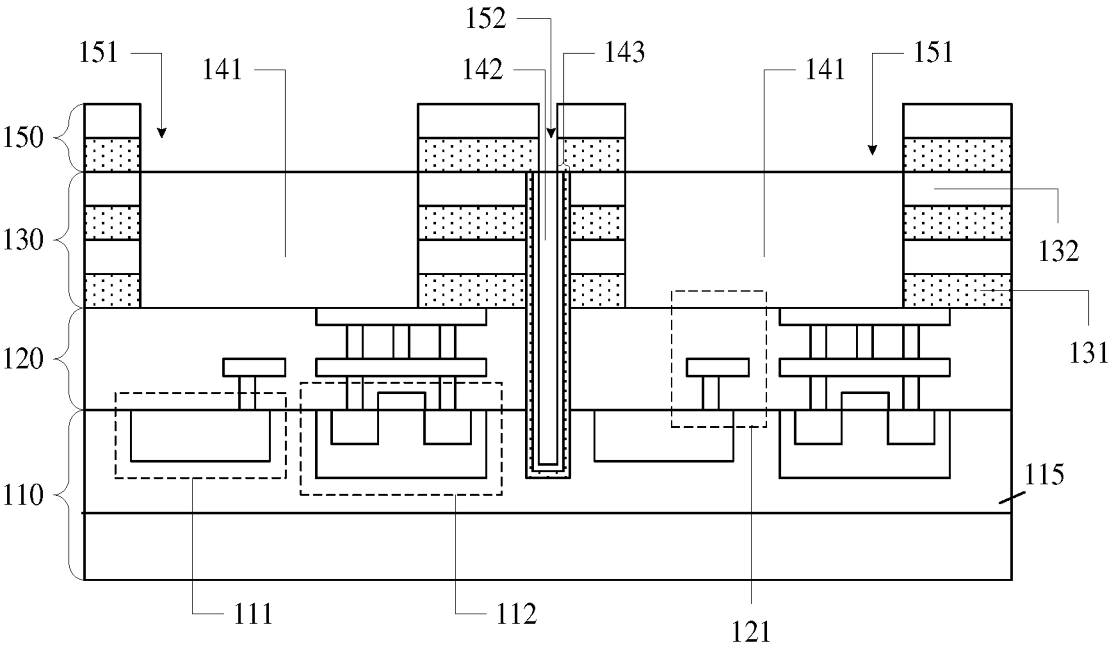

It should be noted that in some embodiments of the present disclosure, the formation method may further include forming a protection structural layer 150 on the connection pad 141 and the isolation wall 142 as shown in FIG. 8; forming a first opening 151 and a second opening 152 in the protection structural layer 150 as shown in FIG. 9, where the bottom of the first opening 151 may expose the connection pad 141, and the bottom of the second opening 152 may expose the isolation wall 142; and at least forming a connection structure in the second opening 152.

The protection structural layer 150 may be configured to further protect internal components of the image sensor. The first opening 151 and the second opening 152 in the protection structural layer 150 may be configured to expose the connection pad 141 and the isolation wall 142 respectively to reduce the occurrence of bridging and short circuit.

For example, the protection structural layer 150 may include a plurality of protection stacked layers; and the protection stacked layer may include a first protection layer 153 and a second protection layer 154 stacked with each other sequentially. For example, the protection structural layer 150 may include one protection stacked layer; that is, the protection structural layer 150 may include the first protection layer 153 and the second protection layer 154 stacked with each other sequentially.

In some embodiments of the present disclosure, the first protection layer 153 may be a TEOS layer, that is, a tetraethyl orthosilicate layer; and the second protection layer 154 may be a silicon nitride layer. The protection structural layer 150 may be formed by a film deposition method including chemical vapor deposition, physical vapor deposition or atomic layer deposition.

The connection structure may be at least formed in the second opening 152 to connect the isolation wall 142 with an external circuit.

The connection structure may be electrically connected to the isolation wall 142 for applying a negative potential to the isolation wall 142. The insulation structural layer 143 may be disposed between the isolation wall 142 and the interconnection structural layer 120; and the insulation structural layer 143 may also extend between the isolation wall 142 and the array substrate 110. Therefore, when the isolation wall 142 is at a negative potential, positive charges may be accumulated near the isolation wall to effectively isolate adjacent photosensitive devices 111. Especially, when the isolation wall 142 extends to the depth at the level where the well region 115 is located, accumulation of positive charges may effectively prevent the increase in dark current in the interface state at the location of the isolation wall and effectively reduce dark count rate.

In some embodiments of the present disclosure, at least forming the connection structure in the second opening 152 may include forming the connection structure in both the first opening 151 and the second opening 152. The connection structure in the first opening 151 may be configured to be electrically connected with the photosensitive device 111 to realize power supply and signal transmission of the photosensitive device 111. The connection structure in the second opening 152 may be configured to apply a negative potential to the isolation wall 142.

In some embodiments of the present disclosure, the image sensor may be a front side illumination image sensor to control cost and ensure yield and reliability. Therefore, the formation method may further include forming a light-receiving structure on the passivation structural layer 130 in which the connection pad 141 and the isolation wall 142 are formed.

The light receiving structure may be configured to receive light.

The light receiving structure may be on the passivation structural layer 130; that is, the light receiving structure may be on the side of the passivation structural layer 130 away from the array substrate 110. Therefore, the passivation structural layer 130 and the interconnection structural layer 120 may be between the photosensitive device 111 and the light receiving structure.

After the light is received by the light receiving structure, the light may be transmitted through the passivation structural layer 130 and the interconnection structural layer 120 sequentially before the light reaches the photosensitive device 111. During the process of the light transmitting the passivation structural layer 130 and the interconnection structural layer 120, the isolation wall 142 may effectively prevent light from propagating along the direction in parallel with the surface of the array substrate 110 and effectively avoid optical crosstalk between adjacent photosensitive devices 111.

In some embodiments, the light-receiving structure may include a color filter layer and a lens layer. For example, forming the light receiving structure may include sequentially forming the color filter layer and the lens layer on the passivation structural layer 130.

Correspondingly, the present disclosure further provides an image sensor.

As shown in FIG. 9, the image sensor may include the array substrate 110, where the photosensitive device 111 may be in the array substrate 110; the interconnection structural layer 120 on the array substrate 110; the passivation structural layer 130 on the interconnection structural layer 120; the connection pad 141 in the passivation structural layer 130 and electrically connected to the photosensitive device 111; and the isolation wall 142 between adjacent photosensitive devices 111 and at least passing through the passivation structural layer 130 and extending to the interconnection structural layer 120.

The array substrate 110 may be configured to form and accommodate the photosensitive device 111, where the photosensitive device 111 may be configured to achieve photoelectric conversion.

The array substrate 110 may include a substrate and the photosensitive device 111 in the substrate.

The substrate may be a working platform for subsequent processes. The material of the substrate may be selected from single crystal silicon, polycrystalline silicon or amorphous silicon; silicon, germanium, a gallium arsenide compound or a silicon germanium compound; a structure with an epitaxial layer or a silicon on an epitaxial layer; or other suitable semiconductor materials, which may not be limited in the present disclosure. In some embodiments, the substrate may be a silicon substrate.

For example, the photosensitive device 111 may be a photodiode (PD). As shown in FIG. 2, in some embodiments, a plurality of photosensitive devices 111 may be in the array substrate 110. For example, FIG. 2 illustrates two photosensitive devices 111 in the array substrate 110.

In some embodiments of the present disclosure, the array substrate 110 may further include the switching device 112. The switching device 112 may be connected to the photosensitive device 111 and configured to control the transmission of photoelectrons generated by the photosensitive device 111. In some embodiments, the array substrate 110 may include a plurality of switching devices 112 correspondingly connected to the plurality of photosensitive devices 111.

In some embodiments of the present disclosure, the photosensitive device 111 may be formed in the well region 115. For example, entire photosensitive device 111 may be in the well region 115. In some embodiments, the array substrate 110 may further include the switching device 112; and the switching device 112 may be also in the well region 115.

The interconnection structural layer 120 may be configured to realize electrical connection between the array substrate 110 and subsequent circuits.

For example, as shown in FIG. 2, the interconnection structural layer 120 may include the first interconnection part 121; the first interconnection part 121 may be electrically connected to the photosensitive device 111; and the plurality of first interconnection parts 121 may be correspondingly connected to the plurality of photosensitive devices 111.

In some embodiments, the array substrate 110 may further include the switching device 112; the interconnection structural layer 120 may further include the second interconnection part 122; the second interconnection part 122 may be electrically connected to the switching device 112; and the plurality of second interconnection parts 122 may be correspondingly connected to the plurality of switching devices 112.

In addition, the interconnection structural layer 120 may further include a dielectric material. The dielectric material may be filled between the interconnection parts to achieve insulation. For example, the dielectric material may be filled between the first interconnection part 121 and the second interconnection part 122. The material may be selected from silicon oxide, silicon nitride, silicon oxynitride, a low K dielectric material (dielectric constant greater than or equal to 2.5 and less than 3.9) or an ultra-low K dielectric material (dielectric constant less than 2.5), or a combination thereof.

The passivation structural layer 130 may be configured to encapsulate and protect the interconnection structural layer 120 and electronic components in the interconnection structural layer 120.

In some embodiments of the present disclosure, the passivation structural layer 130 may include a plurality of passivation stacked layers 133. The passivation stacked layer 133 may include the first passivation layer 131 and the second passivation layer 132 stacked with each other sequentially. For example, in one embodiment shown in FIG. 3, the passivation structural layer 130 may include two passivation stacked layers 133. That is, the passivation structural layer 130 may include two first passivation layers 131 and two second passivation layers 132 which are alternately arranged. For example, the first passivation layer 131 may be a TEOS layer, that is, a tetraethylorthosilicate layer; and the second passivation layer 131 may be a silicon nitride layer.

The connection pad 141 may be electrically connected to the photosensitive device 111 to realize connection between the photosensitive device 111 and an external circuit.

In some embodiments of the present disclosure, the array substrate 110 may further include the switching device 112 connected to the photosensitive device 111; and the connection pad 141 may be connected to the switching device 112 to achieve electrical connection with the photosensitive device 111.

In some embodiments of the present disclosure, the material of the connection pad 141 may be aluminum. As shown in embodiments shown in FIGS. 4-7, the material of the connection pad 141 may be copper-doped aluminum, that is, Al/Cu.

The isolation wall 142 may be configured to reflect optical signals. Along the thickness direction, that is, along the direction perpendicular to the surface of the array substrate 110, the isolation wall 142 may pass through the passivation structural layer 130 and extend into the interconnection structural layer 120, which may effectively prevent lateral propagation of the optical signals in the passivation structural layer 130 and the interconnection structural layer 120 and effectively suppress the crosstalk of the optical signals.

In some embodiments of the present disclosure, the isolation wall 142 may pass through the interconnection structural layer 120 and extend into the array substrate 110. A negative potential may be applied to the isolation wall 142, such that positive charges may accumulate near the isolation wall 142 to effectively isolate adjacent photosensitive devices 111.

In some embodiments of the present disclosure, the photosensitive device 111 may be in the well region 115; and the isolation wall 142 may extend to the depth at the level where the well region 115 is located. When the isolation wall 142 extends to the depth at the level where the well region 115 is located, accumulation of positive charges may effectively prevent the increase in dark current in the interface state at the location of the isolation wall and effectively reduce dark count rate.

It should be noted that, as shown in FIG. 9, in some embodiments of the present disclosure, the image sensor may further include the insulation structural layer 143. The insulation structural layer 143 may be at least between the isolation wall 142 and the interconnection structural layer 120.

The insulation structural layer 143 may be configured to achieve electrical insulation between the isolation wall 142 and other electronic components.

For example, the insulation structural layer 143 may include the insulation stacked layer. The insulation stacked layer may include the first insulation layer 144 and the second insulation layer 145 stacked with each other sequentially. For example, in one embodiment shown in FIG. 3, the insulation structural layer 143 may include one insulation stacked layer. That is, the insulation structural layer 143 may include the first insulation layer 144 and the second insulation layer 145 stacked with each other sequentially. For example, the first insulation layer 144 may be a TEOS layer, that is, a tetraethylorthosilicate layer; and the second insulation layer 145 may be a silicon nitride layer.

In some embodiments of the present disclosure, the isolation wall 142 may also extend into the array substrate 110; and the insulation structural layer 143 may also extend between the isolation wall 142 and the array substrate 110 to achieve insulation between the isolation wall 142 and the array substrate 110.

In some embodiments of the present disclosure, the material of the connection pad 141 may be same as the material of the isolation wall 142. The connection pad 141 and the isolation wall 142 may be formed through a same filling process, which may effectively reduce formation process steps and process difficulty. Moreover, since the material of the connection pad 141 includes aluminum, the material of the isolation wall 142 may also include aluminum, which may effectively improve the reflectivity of the isolation wall 142 and effectively ensure the effect of preventing optical crosstalk.

In addition, as shown in FIG. 9, in some embodiments of the present disclosure, the image sensor may further include the protection structural layer 150 which covers the connection pad 141 and the isolation wall 142; and the connection structure electrically connected to the isolation wall 142 through the protection structural layer 150.

The protection structural layer 150 may be configured to further protect internal components of the image sensor and reduce the occurrence of bridging and short circuit. The connection structure may be configured to realize electrical connection between the isolation wall 142 and the external circuit.

The connection structure may be electrically connected to the isolation wall 142 for applying a negative potential to the isolation wall 142. The insulation structural layer 143 may be disposed between the isolation wall 142 and the interconnection structural layer 120; and the insulation structural layer 143 may also extend between the isolation wall 142 and the array substrate 110. Therefore, when the isolation wall 142 is at a negative potential, positive charges may be accumulated near the isolation wall to effectively isolate adjacent photosensitive devices 111. Especially, when the isolation wall 142 extends to the depth at the level where the well region 115 is located, accumulation of positive charges may effectively prevent the increase in dark current in the interface state at the location of the isolation wall and effectively reduce dark count rate.

The image sensor may include a plurality of connection structures. A part of the plurality of connection structures may be connected to the connection pads 141, and another part of the plurality of connection structures may be connected to the isolation walls 142.

In some embodiments of the present disclosure, the image sensor may be a front side illumination image sensor to control cost, ensure yield and reliability. The image sensor may further include the light receiving structure on the passivation structural layer 130.

The light receiving structure may be configured to receive light.

The light receiving structure may be on the passivation structural layer 130, that is, the light receiving structure may be on the side of the passivation structural layer 130 away from the array substrate 110. Therefore, the passivation structural layer 130 and the interconnection structural layer 120 may be between the photosensitive device 111 and the light receiving structure.

After the light is received by the light receiving structure, the light may be transmitted through the passivation structural layer 130 and the interconnection structural layer 120 sequentially before the light reaches the photosensitive device 111. During the process of the light transmitting the passivation structural layer 130 and the interconnection structural layer 120, the isolation wall 142 may effectively prevent light from propagating along the direction in parallel with the surface of the array substrate 110 and effectively avoid optical crosstalk between adjacent photosensitive devices 111.

In some embodiments, the light-receiving structure may include the color filter layer on the passivation structural layer 130 and the lens layer on the color filter layer.

It should be noted that the image sensor may be formed by the formation method of the image sensor in the present disclosure. Therefore, specific technical solutions of the image sensor refer to above-mentioned embodiments of the formation method of the image sensor, which may not be described in detail herein.

As disclosed above, the isolation wall may be formed in the passivation structural layer, and the isolation wall may be between adjacent photosensitive devices and at least pass through the passivation structural layer and extend to the interconnection structural layer. The isolation wall may achieve optical isolation between adjacent photosensitive devices to suppress optical signal crosstalk and improve the signal-to-noise ratio.

In optional solutions provided in the present disclosure, the isolation wall may also extend into the array substrate and extend to have the depth at the level where the well region is located. The isolation wall may be suitable for being connected to a negative potential, such that positive charges may accumulate near the isolation wall, thereby effectively preventing dark current increase in the interface state at the location of the isolation wall and effectively reducing dark count rate (DCR).

In optional solutions provided in the present disclosure, the conductive material may be filled into the opening and the trench to form the connection pad in the opening and the isolation wall in the trench. The isolation wall and the connection pad may be formed in a same process; on the basis of existing process, the isolation wall may be formed without adding excessively additional process steps, and the process may be simple with low cost.

Although the present disclosure has been disclosed above, the present disclosure is not limited thereto. Any changes and modifications may be made by those skilled in the art without departing from the spirit and scope of the present disclosure, and the scope of the present disclosure should be determined by the scope defined by the appended claims.

What is claimed is:

1. An image sensor, comprising:
- an array substrate, wherein a photosensitive device is in the array substrate;
- an interconnection structural layer, on the array substrate;
- a passivation structural layer, on the interconnection structural layer;
- a connection pad, in the passivation structural layer and electrically connected to the photosensitive device; and
- an isolation wall, between adjacent photosensitive devices and at least passing through the passivation structural layer and extending to the interconnection structural layer.

2. The image sensor according to claim 1, wherein:
- the isolation wall passes through the interconnection structural layer and extends into the array substrate.

3. The image sensor according to claim 2, wherein:
- the photosensitive device is in a well region; and the isolation wall extends to have a depth at a level where the well region is located.

4. The image sensor according to claim 1, further including:
- an insulation structural layer, at least between the isolation wall and the interconnection structural layer.

5. The image sensor according to claim 4, wherein:
- the isolation wall further extends into the array substrate; and
- the insulation structural layer further extends between the isolation wall and the array substrate.

6. The image sensor according to claim 4, wherein:
- a material of the connection pad is same as a material of the isolation wall.

7. The image sensor according to claim 1, further including:
- a protection structural layer, covering the connection pad and the isolation wall; and a connection structure, passing through the protection structural layer to be electrically connected to the isolation wall.

8. The image sensor according to claim 1, wherein:

the image sensor is a front side illumination image sensor.

9. The image sensor according to claim 1, further including:

a light receiving structure, on the passivation structural layer.

10. The image sensor according to claim 9, wherein:

the light receiving structure includes a color filter layer on the passivation structural layer and a lens layer on the color filter layer.

* * * * *